United States Patent [19]

Boreali et al.

[11] Patent Number: 5,540,369
[45] Date of Patent: Jul. 30, 1996

[54] DETACHING LINERLESS LABELS

[75] Inventors: Jeffrey J. Boreali, North Tonawanda; Thomas P. Nash, Getzville; Frank C. DeReu, Tonawanda; Daniel G. Shenk, Niagara Falls, all of N.Y.

[73] Assignee: Moore Business Forms, Inc., Grand Island, N.Y.

[21] Appl. No.: 163,755

[22] Filed: Dec. 7, 1993

[51] Int. Cl.$^6$ .................................................. B65H 35/10
[52] U.S. Cl. .................................. 225/4; 225/91; 225/100
[58] Field of Search .................................. 225/4, 5, 100, 225/91

[56] References Cited

U.S. PATENT DOCUMENTS

| Re. 30,398 | 9/1980 | Schueler . | |
|---|---|---|---|
| 3,135,446 | 6/1964 | Sargent . | |
| 3,161,335 | 12/1964 | Pine et al. . | |
| 3,191,832 | 6/1965 | Davies . | |
| 3,425,607 | 2/1969 | Sargent . | |
| 3,543,982 | 12/1970 | Sargent . | |
| 3,667,663 | 6/1972 | Kacmarcik et al. | 225/100 |
| 3,730,411 | 5/1973 | Brockmuller . | |
| 3,741,451 | 6/1973 | Parenti et al. . | |
| 3,856,196 | 12/1974 | Bayne et al. . | |
| 4,022,364 | 5/1977 | Davis | 225/100 |
| 4,025,023 | 5/1977 | Moffitt | 225/100 |
| 4,261,497 | 4/1981 | Roetter et al. | 225/100 |
| 4,269,341 | 5/1981 | Polko . | |
| 4,375,189 | 3/1983 | Berner et al. . | |
| 4,479,597 | 10/1984 | Johnson et al. . | |
| 4,529,114 | 7/1985 | Casper et al. . | |
| 4,577,789 | 3/1986 | Hofmann et al. | 225/100 |
| 4,601,692 | 7/1986 | Rausing et al. | 225/100 X |
| 4,623,081 | 11/1986 | Hain et al. . | |
| 4,688,708 | 8/1987 | Irvine et al. | 225/100 |
| 4,997,119 | 3/1991 | Meschi . | |
| 5,100,040 | 3/1992 | Kunreuther et al. . | |
| 5,104,022 | 4/1992 | Nakamura et al. . | |
| 5,141,142 | 8/1992 | Ramsey | 225/4 |
| 5,297,783 | 3/1994 | Howard et al. | 225/100 X |
| 5,375,752 | 12/1994 | Michalovic | 225/106 X |

FOREIGN PATENT DOCUMENTS 2144991  3/1973  Germany ........................ 225/100

*Primary Examiner*—Rinaldi I. Rada
*Assistant Examiner*—Clark F. Dexter
*Attorney, Agent, or Firm*—Nixon & Vanderhye

[57] ABSTRACT

Linerless labels are dispensed from a roll and detached along perforation lines using a set of low speed rolls, a set of high speed rolls, and a breaker blade between the sets of rolls. The label-engaging tip of the breaker blade, and at least one roll of each sets of rolls, has a surface that will not stick to the adhesive associated with the linerless labels. One or more conveyor belts, also with non-stick surfaces, may transport the linerless labels from the low speed rolls to the high speed rolls, and transport detached labels away from the high speed rolls. A sensor downstream of the high speed rolls senses the presence of a detached label, and then shuts down both sets of rolls. The apparatus may be operated in an automatic mode so that when a detached label is manually removed from the high speed rolls both sets of rolls automatically start up again, or in a manual mode that requires the operator to activate a switch to restart the detacher each time.

21 Claims, 4 Drawing Sheets

DETACHING LINERLESS LABELS

BACKGROUND AND SUMMARY OF THE INVENTION

There are many prior art pieces of equipment for detaching or bursting continuous business forms in general (such as shown in U.S. Pat. No. 30,398 and U.S. Pat. No. 3,741,451), as well as apparatus for bursting conventional labels with release sheets from a fan fold stack, such as shown in U.S. Pat. Nos. 5,100,040 and 4,375,189. However such equipment is not appropriate for detaching linerless labels. In co-pending application Ser. No. 07/982,699 filed Nov. 30, 1992, now U.S. Pat. No. 5,417,783, linerless label dispenser is provided which is semi-automatic. As each label is dispensed an operator tears the label off using a tear bar. As the operator is applying the dispensed label, the dispenser automatically advances the next label. While this arrangement is useful, it is significant that a sense mark (registration mark) must typically be printed on each label, and the machine is more expensive than desired.

According to the present invention a method and apparatus are provided for the automatic, or optionally semi-automatic, dispensing of linerless labels, which automatically detach or burst the labels using a basically conventional and proven bursting technique, but specifically adapting the technique and the apparatus so that it is capable of functioning with linerless labels. The detacher/dispenser according to the present invention requires no sense mark, the unit may be produced very cost effectively, an operator is not required to manually tear off a label, registration may be achieved quickly and mechanically yet set up by the operator, and a wide variety of linerless labels can be utilized, including those having repositional adhesive or permanent adhesive.

According to one aspect of the present invention, a method of dispensing linerless labels disposed in a rolled web having transverse perforations at spaced locations along the length thereof, and having a first surface (e.g. coated with a release material such as silicone) that will not readily adhere to adhesive (either repositional or permanent) on a second surface of the label web, and a free end of the rolled web. The method is practiced using a pair of slow speed rolls forming a nip between them, a pair of high speed rolls forming a nip between them, and a breaker blade located between the nips. The method comprises the steps of: (a) Pulling the free end of the rolled web with the slow speed rolls, in a first direction. (b) Feeding the free end of the web beneath the breaker blade, with the second surface facing away from the blade, as the web moves in the first direction. And, (c) grasping the free end with the high speed rolls and pulling the web so that the first surface of the web comes into contact with the breaker blade approximately at a perforation thereof, so that the web detaches at the perforation.

The method also preferably comprises the step (d) of sensing the detached label downstream of the high speed roll in the first direction, and stopping the low speed rolls in response to the sensing. Step (d) may be practiced by optical sensing. The method may also include restarting the high and low speed rolls when a label is removed from the high speed rolls, or requiring manual restart of the low and high speed rolls after step (d).

Step (b) may be practiced by using one or more conveyor belts having non-stick upper surfaces for engaging the second surface of the labels and transporting them in a first direction. The method may also comprise the step of carrying the detached labels away with the conveyor belts.

According to another aspect of the present invention a detacher for continuous business forms is provided, particularly for linerless labels. The detacher comprises the following elements: First and second low speed rolls forming a nip between them. First and second high speed rolls defining a nip between them. The first and second low and high speed rolls rotatable about parallel axes with an imaginary plane extending between the nips of the low and high speed rolls. A breaker blade mounted between the low and high speed rolls, on the first roll side of the imaginary plane extending between the nips, the breaker blade having a tip portion extending to the opposite side of the plane. A let-off roll on the opposite side of the low speed rolls from the breaker blade, and defining a let-off axis parallel to the low and high speed rolls. And, a sensor on the opposite side of the high speed rolls from the breaker blade, for sensing a label passing through the nip of the high speed rolls.

At least the second roll of both the low speed and high speed rolls has a non-stick surface, and the breaker blade has a tip portion which engages the business form which has a non-stick surface. A sensor is typically provided on the opposite side of the high speed rolls from the breaker blade, and a one way clutch is provided for the high speed rolls to allow detached labels to be pulled through them when the high speed rolls have stopped. Typically both the first and second rollers of the low and high speed rolls have non-stick surfaces, for example one surface may be plasma coated, and the other may be urethane or impregnated with silicone oil. One or more transport belts having non-stick surfaces also may be provided between the high and low speed rolls for feeding linerless labels from the low speed rolls to the high speed rolls, and the same belts can be used to carry the detached labels away.

Various control means may also be provided comprising control means for controlling the operation of the low and high speed surfaces, the control means including means for automatically controlling the low speed rolls in response to the sensor, and means for manually controlling the low speed rolls once stopped by the sensor. The control means preferably includes a multi-position electrical switch having an automatic position to which the switch may be turned and maintained in that position, and a manual position to which the switch may be turned is automatically spring biased away from that position.

It is the primary object of the present invention to provide a method and apparatus for the cost effective simple, easy, and reliable dispensing/detaching of linerless labels from a roll. This and other objects of the invention will become clear from an inspection of the detailed description of the invention and from the appended claims.

BRIEF DESCRIPTION OF THE DRAWINGS

FIG. 1 is a top plan schematic view of exemplary apparatus according to the present invention;

DETAILED DESCRIPTION OF THE DRAWINGS

Figure 3:
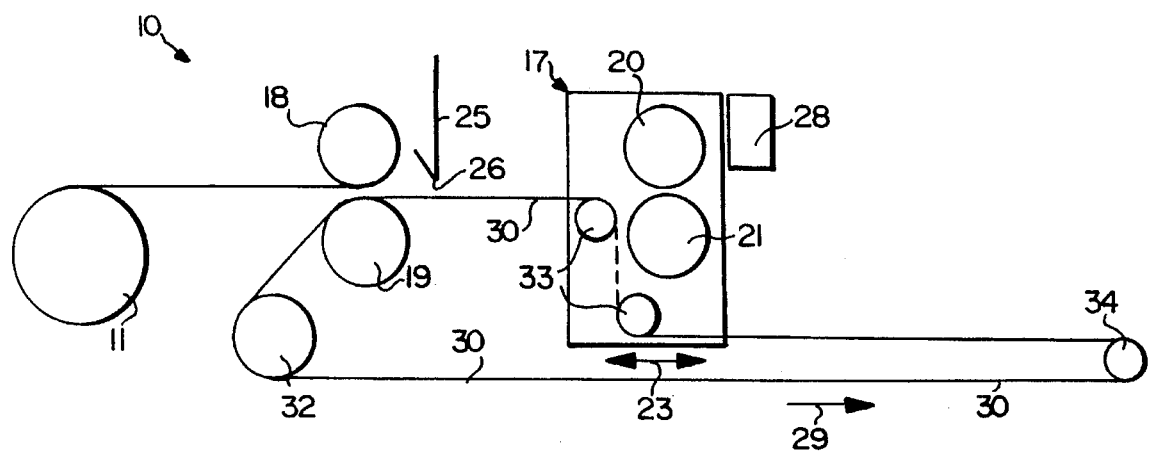
FIG. 3 is a schematic side view of the apparatus of FIGS. 1 and 2, showing the operational relationships between the high and low speed rollers and conveyor belts.
Figure 2:
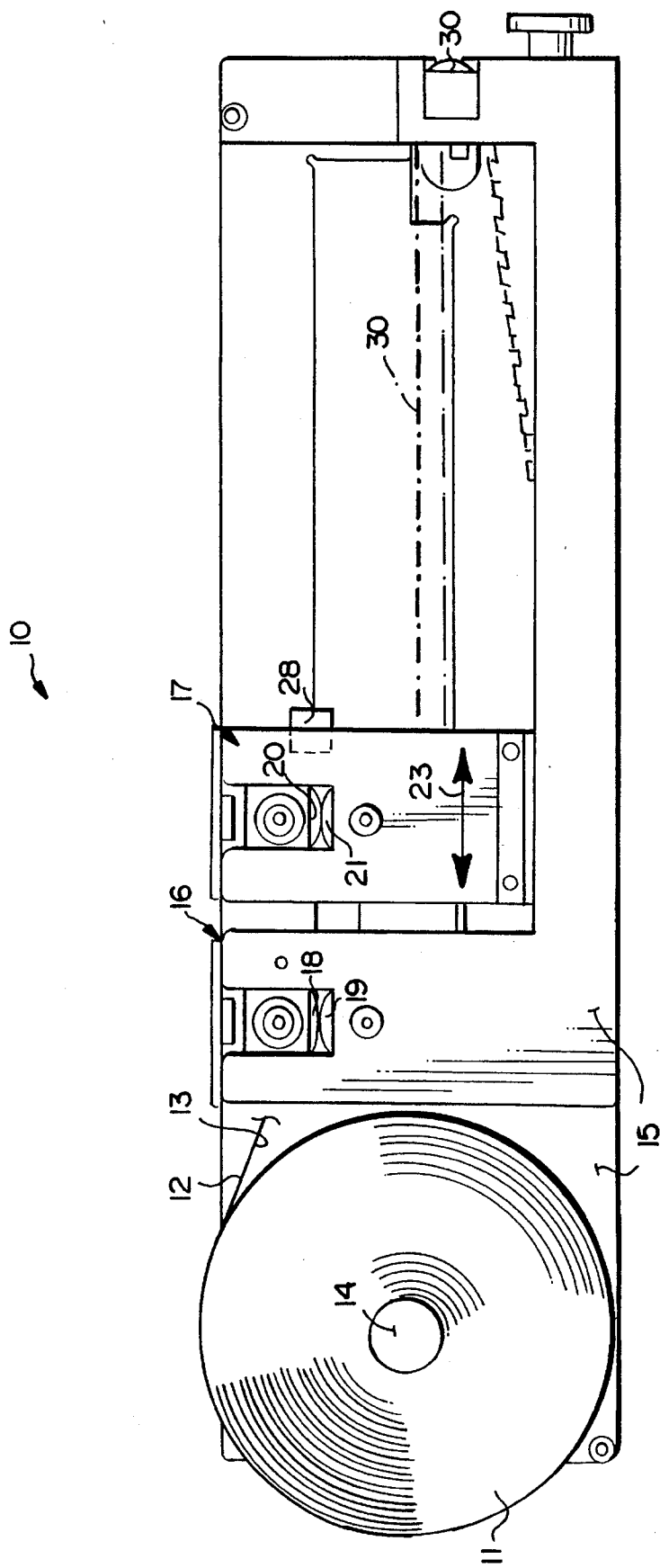
FIG. 2 is a side view of the apparatus of FIG. 1.
Figure 3:
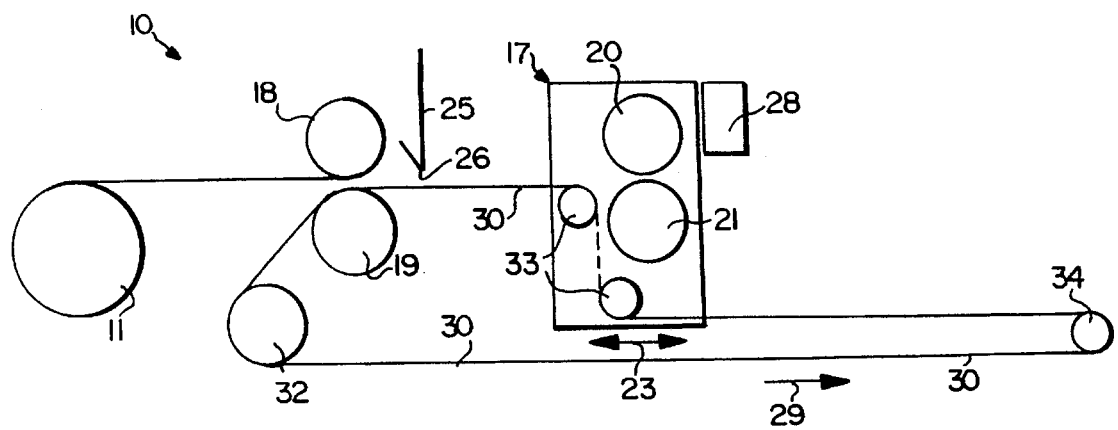
Figure 4:
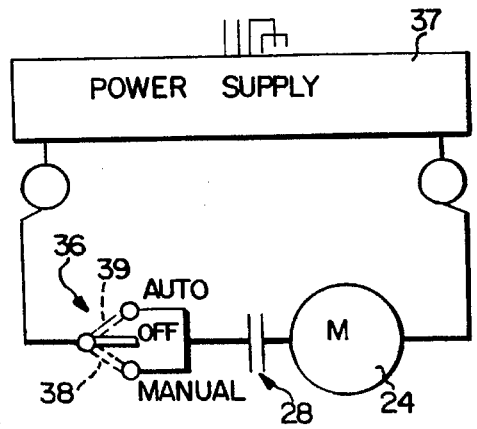

A detacher for linerless label type business forms according to the present invention is shown generally by reference numeral 10 in FIGS. 1 through 3. The apparatus 10 is utilized for detaching linerless labels from a roll 11 of linerless labels, such as those having permanent adhesive, or Cleantac® repositional adhesive available from Moore Business Forms, Inc. of Lake Forest, Ill. As seen in FIG. 2, the labels on the roll 11 have an upper surface 12 on which indicia may be imprinted, which is coated with a release material, such as silicone, and a lower surface 13 which contains the permanent, repositional, or other adhesive. The roll 11 is mounted for let off by the shaft 14, which is in turn mounted on a stationary frame 15.

The detacher 10 further comprises low speed rolls 16 and high speed rolls 17. The rolls 16, 17 are illustrated in FIGS. 3 and 5a–5c, comprising first and second low speed rolls 18, 19, and first and second high speed rolls 20, 21, each set of rolls 16, 17 having a nip between them.

Preferably all of the rollers 18–21 have non-stick surfaces so that adhesive will not build up thereon. This is especially important for the lower rollers 19, 21, however. Preferably the lower rollers 19, 21, which typically are of aluminum, steel, or stainless steel, are plasma coated. For example they may be plasma coated using a flame spraying process, such as coating #936 available from Plasma Coating, Inc. of Waterbury, Conn. While the upper rolls 18, 20 also may be plasma coated, since they will not be directly engaging adhesive, they may have less of a non-stick surface. For example they could be made of urethane, or they may be of a material that "bleeds" silicone oil over a period of time, such as available from Silicone Products and Technology, Inc. of Lancaster, N.Y. The high speed roller housing 17 may be mounted on a carriage so that its position in the dimension 23 may be adjusted depending upon the length of the linerless labels desired, the low speed roller housing 16 remaining stationary. Movement of the carriage 17 for the high speed rolls may be accomplished by any suitable automatic or manual means.

The high and low speed rolls 18–21 typically are driven by a common motor 24 (see FIG. 1), connected through different belts, gears, or chains and pulleys to the roll sets 16, 17 so as to provide a speed differential between the high speed rolls and the low speed rolls.

Note that the high speed rolls and low speed rolls are rotatable about parallel axes, with an imaginary plane extending between the nips of the rolls 18, 19 and 20, 21, as clearly seen in FIGS. 3 and 5a–5c. Also a breaker blade 25 (see FIGS. 1, 3, and 5a–5c), between the housings for rolls 16, 17, just downstream of the rolls 18, 19, is provided. The breaker blade includes a bottom surface 26, disposed just above the web of labels from the roll 11, which also is preferably a non-stick surface, to prevent adhesion of the labels being burst by the blade 25. The surface 26 may be plasma coated, or the surface 26 may be covered with a silicone tape. The surface or tip 26 of the breaker blade 25 extends on the opposite side of the imaginary plane between the nips of the rolls 18, 19 and 20, 21 from the side of that plane on which the first rolls 18, 20 are disposed, as clearly seen in FIGS. 5a–5c.

Also according to the present invention, just downstream of the high speed rolls 20, 21, mounted in the housing 17, is a sensor 28 for sensing the position of a label from the roll 11 downstream of the high speed rolls, 20, 21 (that is in the direction 29 therefrom). The sensor 28 may be of a wide variety of types, but preferably comprises an optical sensor such as those available from Keyence Corporation of America, Fair Lawn, N.J., such as model #PZ2-42 (a short range diffuse-reflective sensor), PZ2-61 (a polarized retro-reflective sensor), or PZ2-51 (a two piece through-beam sensor).

As seen in FIGS. 1 and 3, the detacher 10 also preferably comprises at least one—and preferably a plurality of spaced—transport belts. A transport belt is seen by reference numeral 30 in FIG. 3, and as illustrated in FIG. 1 a plurality of such belts 30 spaced in a direction 31 perpendicular to the direction of travel 29 of the labels during detachment, is preferably provided. As is also clear from FIG. 3, the belts 30 not only assist in transporting labels from the roll 11 to the high speed rolls 20, 21 (just before the nip thereof), they also extend (although at a lower level, below the roll 21 rather than substantially at the nip) past the high speed rolls 20, 21 to carry detached labels away from the high speed rolls 20, 21 in the direction 29. The belts 30 not only pass over the lower low speed roll 19, but also pass over the roller 32 mounted so that it is rotatable about a horizontal axis which is stationary to the frame 15, idler rolls 33 which are mounted on the carriage 17, and idler roll 34 at the end of the frame 15. The belts 30 are driven at the same speed as the low speed rolls 18, 19, in fact typically being driven by the roll 19 (and/or the roll 32). The belts 30 also must have a non-stick surface. For example they may be woven fiberglass impregnated with silicone so that the outer surface thereof, containing silicone, has a high enough co-efficient of friction to drive and transport a label, but a low enough co-efficient of friction to release the label from the belt with very little effort and no damage to the label.

Figure 4:
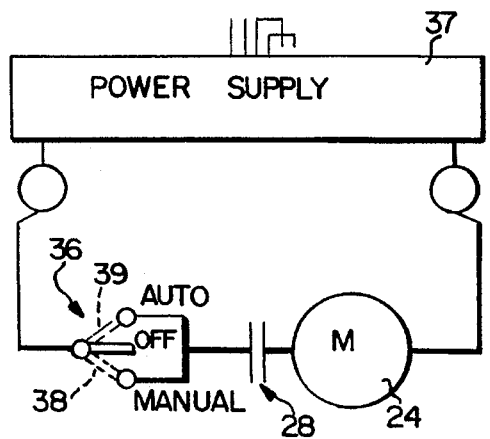
FIG. 4 is an electrical schematic showing control of the components of the apparatus of FIGS. 1 through 3.

FIG. 4 illustrates an electrical schematic, comprising components for allowing starting and stopping of the machine. The motor 24, sensor 28, and a multi-position electrical switch 36 are connected up to a power supply 37, such as a 115 volt AC source. The electrical switch 36 has an off position, illustrated in solid line in FIG. 4, to which it may be moved manually into the position illustrated at dotted line at 38 in FIG. 4. The switch 36 is spring biased from the manual position 38 to the off position, so that once it is turned to the manual position and one operation completed, the switch automatically will return to the off position. The switch 36 also has an automatic position illustrated by dotted line 39 in FIG. 4. The switch 36 will stay in the automatic position 39 once moved to that position.

Figure 5A:
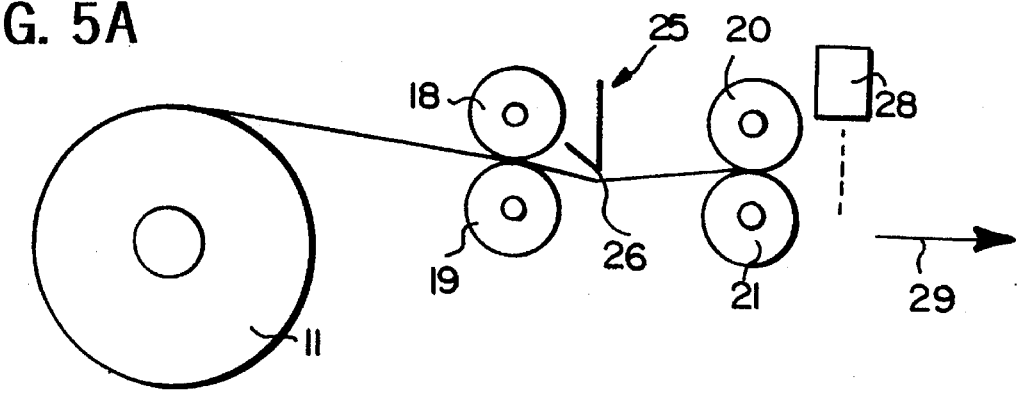
FIGS. 5a through 5c illustrate schematically an exemplary manner of bursting according to the present invention.
Figure 5B:
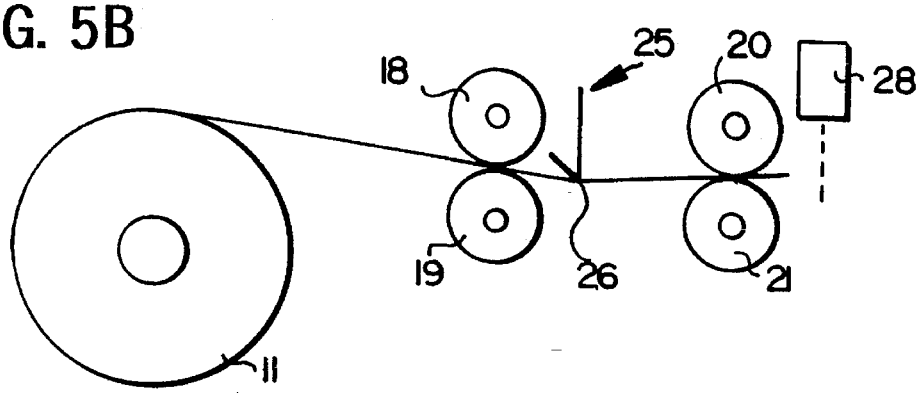
Figure 5C:
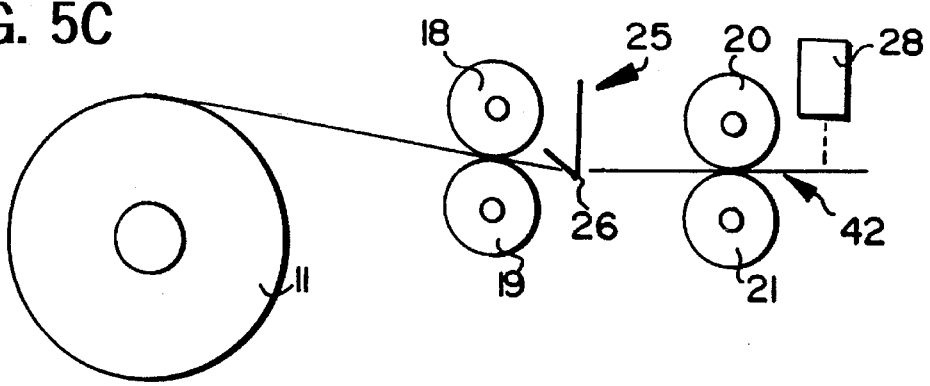

FIGS. 5a–5c schematically illustrate how bursting of the linerless labels from roll 11 is accomplished. The label web passing through the nip of the low speed rolls 18, 19 is transported by the belts 30 (see FIG. 3) to just before the nip of the high speed rolls 20, 21. As the high speed roller nip grabs the leading edge of the label web, since the high speed rollers travel about twice as fast as the low speed rollers, and because the high speed roller carriage 17 is accurately positioned at the start of the operation a desired position depending upon the lengths between perforations of the labels from the roll 11, as the labels are pulled taut as illustrated in FIG. 5b, the labels are moved upwardly so that a leading perforation line thereof comes in contact with the tip 26 of the breaker blade 25, causing bursting as seen in FIG. 5c. The length of the burst label is the distance between the bursting blade tip 26 and the nip between the high speed rolls 20, 21. Preferably a one way clutch is associated with the rolls 20, 21 (which may be of any conventional design) which allows the operator to remove a detached label if the apparatus 10 is shut down (in the manual operation, with the switch moved against the spring bias to the position 38 of FIG. 4). A detached label is indicated generally by reference numeral 42 in FIG. 5c.

The detacher 10 may be operated in several different modes. If it is desired to operate it in the manual mode, the labels 42 may be dispensed one at a time.

To operate the detacher 10 in the manual mode, the operator activates the apparatus 10 by turning the switch 36 to the manual position illustrated in dotted line at 38 and then releasing it. The switch 36 automatically returns to the off position, under spring bias, when released. The movement of the switch to the position 38 activates the apparatus 10 for the dispensing of one label after the perforation between labels is burst, and the label 42 is detached, the sensor 28 senses the detached label 42—as illustrated in FIG. 5c—and stops the motor 24, shutting down the entire unit 10. The operator then grasps the label 42 with her/his fingers, and pulls it through the high speed rolls 20, 21 (which is possible because of the conventional one way clutches associated with the rolls 20, 21). When the operator wants to dispense the next label, the switch 36 is again moved to the position 38 and released.

In the automatic mode, the labels 42 are dispensed consecutively without having to reactivate the switch 36 after each label is dispensed. In the automatic mode, the switch 36 is moved to the position illustrated at 39 in FIG. 4. After each label 42 is detached it is sensed by the sensor 28, again stopping the motor and shutting down the dispenser. Once the operator removes the label 42, the sensor 28 automatically restarts the motor 24 initiating detachment of the next label, which process continues automatically until the entire roll 11 has been dispensed.

Alternatively, the sensor 28 can be deactivated or eliminated, and the unit may operate continuously, the detached labels 42 automatically falling down on the conveyor belts 30, which can then lead them to a stacking tray, and it would be necessary to move the switch 36 back to the off position once the number of labels desired had reached the stacking tray. Also, the apparatus 10 might be utilized with a wipe roller impregnated with solvent to wipe an area of silicone off of the face 12 of the web of linerless labels from the roll 11, so that labels could be easily printed, with an ink jet, dot matrix impact, direct thermal, thermal transfer, or hot stamp printer.

It will thus be seen that according to the present invention a simple, yet effective and versatile, method and apparatus have been provided for the dispensing of linerless labels. While the invention has been herein shown and described in what is presently conceived to be the most practical and preferred embodiment thereof, it will be apparent to those of ordinary skill in the art that many modifications may be made thereof within the scope of the invention, which scope is to be accorded the broadest interpretation of the appended claims so as to encompass all equivalent structures and methods.

What is claimed is:

1. A method of dispensing linerless labels disposed in a rolled web having transverse perforations at spaced locations along the length of the web, and the web having a first surface that will not readily adhere to adhesive on a second surface of the web, and the rolled web having a free end; the method using a pair of slow speed rolls having non-stick surfaces, with a nip between them, and a pair of high speed rolls having non-stick surfaces, with a nip between them, and a breaker blade between the slow speed rolls and the high speed rolls; said method comprising the steps of:

(a) pulling the free end of the rolled web with the slow speed rolls, the web engaged by the non-stick surfaces of the rolls, in a first direction;

(b) feeding the free end of the web beneath the breaker blade, with the second surface facing away from the blade, as the web moves in the first direction by engaging the second surface after it passes the slow speed rolls with at least one low friction conveyor belt moving in the first direction; and (c) grasping the free end with the high speed rolls, the web engaged by the non-stick surfaces of the rolls, and pulling the web so that the first surface of the web comes into contact with the breaker blade approximately at a perforation thereof, so that the web detaches at the perforation.

2. A method as recited in claim 1 comprising the further step (d) of sensing the detached label downstream of the high speed rolls in the first direction, and stopping the low speed rolls in response to the sensing.

3. A method as recited in claim 1 comprising the further step of moving the labels away from the high speed rolls, after detachment, using the at least one low friction conveyor belt.

4. A method of dispensing linerless labels disposed in a rolled web having transverse perforations at spaced locations along the length of the web, and the web having a first surface that will not readily adhere to adhesive on a second surface of the web, and the rolled web having a free end; the method using a pair of slow speed rolls with a nip between them, and a pair of high speed rolls with a nip between them, and a breaker blade between the slow speed rolls and the high speed rolls; said method comprising the steps of:

(a) pulling the free end of the rolled web with the slow speed rolls, in a first direction;

(b) feeding the free end of the web beneath the breaker blade, with the second surface facing away from the blade, as the web moves in the first direction;

(c) gasping the free end with the high speed rolls and pulling the web so that the first surface of the web comes into contact with the breaker blade approximately at a perforation thereof, so that the web detaches at the perforation; and (d) sensing the detached label downstream of the high speed rolls in the first direction, and stopping the low speed rolls in response to the sensing.

5. A method as recited in claim 4 comprising the further step of automatically restarting the low speed rolls after the detached label has been removed from the high speed rolls.

6. A method as recited in claim 4 comprising the further steps of removing the detached label from between the high speed rolls, and then manually initiating operation of the low speed rolls to repeat step (a).

7. A method as recited in claim 4 wherein step (d) is practiced by optically sensing the detached label.

8. A detacher for linerless label type business forms, comprising:

first and second low speed rolls rotatable about parallel axes, and forming a nip between them with at least the second of the rolls having a non-stick surface;

first and second high speed rolls rotatable about axes parallel to each other and to said low speed roll axes, and defining a nip between them, with at least the second of the rolls having a non-stick surface;

said low speed rolls spaced from said high speed rolls in a first direction, with an imaginary plane extending between the nips; and a breaker blade mounted between said low and high speed rolls and on a first side of the imaginary plane extending between the nips of said low speed rolls and said high speed rolls, said first side being closer to said first roll of said low speed rolls than to said second roll of said low speed rolls, the breaker blade having a tip portion extending to a second side of the plane which is closer to said second roll of said low speed rolls than to said first roll of said low speed rolls, at least the tip portion having a non-stick surface.

9. A detacher as recited in claim 8 further comprising a let-off mechanism mounted on a side of said low speed rolls opposite said breaker blade, and defining an axis parallel to said low and high speed rolls.

10. A detacher as recited in claim 8 further comprising a sensor disposed on a side of said high speed rolls opposite said breaker blade, said sensor for sensing the position of a label.

11. A detacher as recited in claim 10 further comprising control means for controlling the operation of said low and high speed rolls, said control means including means for automatically controlling said low speed rolls in response to said sensor, and means for manually controlling said low speed rolls once stopped by said sensor.

12. A detacher as recited in claim 11 wherein said control means includes a multi-position electrical switch having an automatic position to which said switch may be turned and maintained in that position, and a manual position to which the switch may be turned which is automatically spring biased away from that position.

13. A detacher as recited in claim 8 wherein said non-stick surfaces comprise material which bleeds oil.

14. A detacher as recited in claim 8 further comprising at least one transport belt disposed between said low and high speed rolls for transporting labels between said low and high speed rolls, said at least one transport belt having a non-stick surface for engaging the labels.

15. A detacher as recited in claim 14 wherein said transport belt also continues on an opposite side of said high speed rolls from said low speed rolls, to transport detached labels away from said high speed rollers.

16. A detacher as recited in claim 8 wherein said non-stick surfaces are plasma coated surfaces.

17. A detacher comprising:

first and second low speed rolls each having a non-stick peripheral surface, forming a nip between them;

first and second high speed rolls defining a nip between them;

said first and second low and high speed rolls rotatable about axes which are all parallel to each other, with an imaginary plane extending between the nips of said low and high speed rolls;

a breaker blade mounted between said low and high speed rolls, and on a first side of the imaginary plane extending between the nips of said low speed rolls and said high speed rolls, said first side being closer to said first roll of said low speed rolls than to said second roll of said low speed rolls, the breaker blade having a tip portion extending to a second side of the plane which is closer to said second roll of said low speed rolls than to said first roll of said low speed rolls;

a let-off roll on an opposite side of said low speed rolls from said breaker blade, and defining a let-off axis parallel to said axes of said low and high speed rolls;

a sensor on an opposite side of said high speed rolls from said breaker blade, for sensing a label passing through the nip of said high speed rolls.; and at least one transport belt disposed between said low and high speed rolls for transporting labels between said low and high speed rolls.

18. A detacher as recited in claim 17 further comprising control means for controlling the operation of said low and high speed rolls, said control means including means for automatically controlling said low speed rolls in response to said sensor, and means for manually controlling said low speed rolls once stopped by said sensor.

19. A detacher as recited in claim 18 wherein said control means includes a multi-position electrical switch having an automatic position to which said switch may be turned and maintained in that position, and a manual position to which the switch may be turned which is automatically spring biased away from that position.

20. A detacher as recited in claim 17 wherein said transport belt also continues on an opposite side of said high speed rolls from said low speed rolls, to transport detached labels away from said high speed rolls.

21. A detacher as recited in claim 17 wherein said first and second low speed rolls and said first and second high speed rolls each have a plasma coated, non-stick surface.

* * * * *